(12) United States Patent
Solberg et al.

(10) Patent No.: US 6,370,767 B1
(45) Date of Patent: Apr. 16, 2002

(54) METHOD FOR FABRICATING AN ELECTRICAL APPARATUS

(75) Inventors: Terry B. Solberg, Golden Valley;
Daryl E. Weispfennig, Chanhussen;
Michael K. Hennies, Big Lake, all of MN (US)

(73) Assignee: Artesyn Technologies, Inc., Eden Prairie, MN (US)

( * ) Notice: Subject to any disclaimer, the term of this patent is extended or adjusted under 35 U.S.C. 154(b) by 0 days.

(21) Appl. No.: 09/411,572

(22) Filed: Oct. 4, 1999

(51) Int. Cl.[7] ................................................. H05K 3/32
(52) U.S. Cl. ........................ 29/840; 438/111; 29/827; 29/832; 29/835; 29/564.3
(58) Field of Search ......................... 29/832, 835, 836, 29/839, 840, 827, 564.3, 564.6; 83/929.1, 929.2; 438/111, 121, 122, 123, FOR 366, FOR 380, FOR 381; 156/306.6, 306.9

(56) References Cited

U.S. PATENT DOCUMENTS

| 4,338,717 A | * | 7/1982 | Damon | 29/839 |
| 4,602,678 A | | 7/1986 | Fick | |
| 4,685,987 A | | 8/1987 | Fick | |
| 4,689,875 A | * | 9/1987 | Solstad | 29/827 |
| 4,842,911 A | | 6/1989 | Fick | |
| 4,982,376 A | * | 1/1991 | Megens et al. | 29/840 |
| 5,055,909 A | | 10/1991 | Culver | |
| 5,422,788 A | | 6/1995 | Heinen et al. | |
| 5,467,251 A | | 11/1995 | Katchmar | |
| 5,471,366 A | | 11/1995 | Ozawa | |
| 5,678,457 A | | 10/1997 | Bergerson | |
| 5,914,873 A | | 6/1999 | Blish, II | |
| 5,959,842 A | | 9/1999 | Leonard et al. | |

FOREIGN PATENT DOCUMENTS

| FR | 2571545 | | 4/1986 | |
| JP | 6216532 | * | 8/1994 | 29/832 |

* cited by examiner

Primary Examiner—Peter Vo
Assistant Examiner—Rick Kiltae Chang
(74) Attorney, Agent, or Firm—Kirkpatrick & Lockhart LLP

(57) ABSTRACT

A method and apparatus for dissipating heat from an electrical component. The method includes providing a planar element including a first electrically and thermally conductive region and a second electrically and thermally conductive region, such that the first and second regions define a spacing therebetween, and wherein the planar element includes at least one mechanically stabilizing tie connected between the first and second regions across the spacing, directly connecting a first terminal of an electrical component to the first region, directly connecting a second terminal of the electrical component to the second regions, such that the electrical component bridges the spacing, and removing the at least one mechanically stabilizing tie from between the first and second regions.

26 Claims, 7 Drawing Sheets

METHOD FOR FABRICATING AN ELECTRICAL APPARATUS

CROSS-REFERENCE TO RELATED APPLICATIONS

Not Applicable.

STATEMENT REGARDING FEDERALLY-SPONSORED RESEARCH AND DEVELOPMENT

Not Applicable.

BACKGROUND OF INVENTION

1. Field of Invention

The present invention relates to electrical components which generate heat during use and, more particularly, to methods and apparatuses for dissipating heat from such electrical components.

2. Description of the Background

Electrical components, including electrical semiconductor components, are used in numerous electrical devices in all sorts of applications. Many electrical components generate heat during use due to the electrical current flow therethrough. If not effectively dissipated, this generated heat can be detrimental to the performance of the electrical component and to nearby structure or components, both in terms of electrical performance and in terms of mechanical integrity.

Many methods are used to prevent the excessive build-up of heat or temperature. Considerable heat may be dissipated through convection to the gas surrounding the electrical component, such as by inducing a forced flow of air across the electrical component. However, inducing air flow requires adequate space such as for a fan and for air flow channels, and also increases cost. Some components are housed in a sealed compartment, which may for instance be filled with nitrogen, rendering forced gas flow impossible. Many components require a higher rate of heat dissipation than can be provided by mere convection.

Accordingly, it is common to increase heat dissipation by attaching a heat sink to a face of the electrical component. The heat sink is typically formed of metal, although other highly thermally conductive materials may also be used. Heat is conducted from the electrical component to the heat sink and then conducted along the heat sink away from the electrical component and dissipated from the surfaces of the heat sink. The heat sink may have a considerable thermal mass relative to the electrical component, absorbing a considerable amount of the heat initially generated by the electrical component. The heat sink typically has a larger surface area than the electrical component. Because heat dissipated by convection is a function of the surface area exposed to the convecting fluid, heat convects from the heat sink much more rapidly than from the electrical component.

While the heat sink itself may function very well, attachment of the heat sink to the electrical component poses problems. The heat sink must make sufficient thermal contact with the electrical component over a significant surface area, so heat will adequately conduct from the electrical component to the heat sink. Providing sufficient thermal contact may be difficult, particularly over a long duration of the life of the electrical component. Providing sufficient thermal contact is more difficult if the attachment is under repeated mechanical stress, such as when subject to vibration, or if the attachment is subject to shock such as if the electrical device is inadvertently dropped. Providing sufficient thermal contact is also more difficult when the attachment repeatedly undergoes thermal stress due to changes between environmental conditions as well as between operating and non-operating conditions. The severity of the thermal stress is a function both of the magnitude of the temperature change and the rate of temperature change witnessed by the component. The attachment mechanism must ensure intimate physical contact over all operating and use conditions.

Each electrical component typically includes two or more electrical leads that must be electrically insulated one from the other. The heat sink must not provide an electrically conductive path between such leads, or even pose a risk of such a short circuit. In many applications and particularly in power environments, the heat sink must prevent any risk of an electrically conductive path or short circuit from each electrical component to other components in the electrical device. Heat sinks may be formed of electrically insulative or dielectric materials to prevent such a short, but most electrically insulative materials are also thermally insulative, and the heat sink must be thermally conductive to effectively increase heat dissipation. Instead, the attachment between the heat sink and the electrical component may be electrically insulative, and the heat sink formed of metal.

The electrical component may undergo a significant temperature difference from a cold or room temperature when not being used to a high temperature steady state operating condition. If the electrical component is used outdoors, the environment of use of the electrical component may also include temperature and humidity extremes, such as from sub-zero temperatures to desert sun and heat. The heat sink is typically formed of a different material than the electrical component, and thus typically has a coefficient of thermal expansion which is different than the coefficient of thermal expansion of the electrical component. The attachment between the electrical component needs to accommodate the differing thermal expansion rates over repeated cycling between hot and cold temperatures.

The size of any attachment means between the electrical component and the heat sink should be minimized, so as to reduce the size of the electrical component/heat sink product. Many methods of attachment require significant additional space beyond that required just by the electrical component and the heat sink. A certain safety clearance may be required between neighboring electrical components, which may further compromise space requirements if the connection means between the heat sink and the electrical component adds additional size. To reduce the total cost of the electrical component, the process of assembling the heat sink to the electrical component should be as simple as possible. Many methods and/or structures of attachment are not easily automated, increasing the final cost of the electrical component/heat sink product.

Many heat sinks are attached to electrical components with mechanical fasteners, such as one or more bolts, clips or clamps. The mechanical fasteners take up space, which is significant in the environment that many electrical components are used. To electrically insulate the heat sink from the electrical component(s), an additional electrically insulating structure or material must be placed in the interface between the heat sink and the electrical component(s). For instance, it is known to place a material in the interface between the heat sink and the electrical component, which are then attached together with bolts. One such material, known as BOND-PLY®, a registered trademark of Bergquist Company, Minneapolis, Minn., includes a layer of fiber glass cloth between layers of precured silicone. The precured silicone is then placed against the heat sink prior to mounting the heat sink to the electrical component. Polyester sheet materials have also been used between the heat sink and the electrical component. In general, polyesters are too thermally insulative, and must be applied in too thin a layer to be usable. That is, to provide adequately low thermal resistance, the polyester sheet must be at a thickness such as about one mil, which renders the material too weak and easily punctured. As another example, a cured silicone-based laminate on a KAPTON® film structure material, a registered trademark of E. I. DuPont de Nemours and Co., Wilmington, Del. is available in sheet form of about 0.0025 inch thick in a K-10 XT grade which has high tensile strength and good puncture resistance. However, the KAPTON® film material is expensive and significantly increases the cost of the electrical component/heat sink combination.

To ensure intimate physical contact between the electrical component, the electrically insulating structure and the heat sink, bolts must be properly torqued, and clips must be designed and attached to provide a proper compression force. Provided a proper torque or compression force is applied to the bolt/clip(s), the positive structural connection provided by most bolt/clip(s) will adequately accommodate the differing thermal expansion rates between the electrical component and the heat sink.

If formed of an electrically conductive material such as metal, the bolt/clip(s) may introduce an undesired potential electrical flow path between the heat sink and the electrical component, despite the presence of the electrically insulating structure. Alternatively, additional size may be required to adequately space the bolt/clip(s) relative to the electrical component. The bolt/clip(s) and electrically insulating structure require additional cost for manufacture and stocking. Assembly with the bolt/clip(s) and insulating structure is difficult to automate and further increases cost.

As an alternative to mechanical fasteners, adhesives have been used to connect an electrical component to a heat sink, such as a silicone based adhesive or an epoxy based or urethane adhesive such, or an acrylic based adhesive. The adhesive is applied in a liquid or paste condition to the interface between the electrical component and the heat sink. Many such adhesives come in two parts which require mixing immediately prior to application. The electrical component and the heat sink are brought into contact with the adhesive in the interface, and the adhesive is then cured or solidified by time, heat, and/or ultraviolet or infrared radiation. The relevant art also teaches using such an epoxy to bond an insulated printed circuit board having many electrical components connected thereto to a heat sink.

To be effective for the heat sink, the adhesive has to provide minimal thermal resistance, which is generally addressed by having a minimal thickness and/or by adding a thermal carrier. To be effective particularly in a power environment, the adhesive has to also be electrically insulative, which significantly limits the types of adhesives that can used. For instance, the adhesive may be an electrically resistive base material loaded with a thermally conductive carrier such as a boron nitride or aluminum oxide filler. Additionally, the added cost of the adhesive substance and its application should be minimized.

Adhesive attachments also have proven problematic. Care must be taken to sufficiently "wet-out" the adhesive, to provide intimate physical contact and minimize the resistance to thermal conduction at the interface. The desire to provide a sufficiently thick layer to ensure adequate wetting-out runs counter to the desire for the adhesive layer to be as thin as possible, and consistent application at the same thickness is difficult. The degree of physical and thermal contact may worsen as many adhesives degrade over time or through thermal cycling and become less flexible or more brittle. Aging of the cured adhesive may also detrimentally affect the thermal conductivity through the adhesive. The problem of providing intimate physical contact may worsen particularly due to the shear induced by thermal cycling caused by differing thermal expansion rates. Application of the adhesive is messy and difficult to automate. Depending on the type of adhesive, and particularly if the adhesive involves a reaction between two or more substances, the adhesive may produce out-gassing which is detrimental to the electrical component.

Accordingly, there exists a need in the relevant art for a method to attach electrical components to a heat sink in a cost-effective manner without sacrificing the performance of the components. There further exists a need in the relevant art for a highly automated method for attaching electrical components to a heat sink, and which uses less expensive raw materials in comparison to the relevant art. There also exists a need in the relevant art for a method to attach electrical components to a heat sink in a space-effective manner without sacrificing the performance of the components.

BRIEF SUMMARY OF THE INVENTION

The present invention is directed to a method for fabricating an electrical apparatus. The method includes providing a planar element including a first electrically and thermally conductive region and a second electrically and thermally conductive region, such that the first and second regions define a spacing therebetween, and wherein the planar element includes at least one mechanically stabilizing tie connected between the first and second regions across the spacing, directly connecting a first terminal of an electrical component to the first region, directly connecting a second terminal of the electrical component to the second regions, such that the electrical component bridges the spacing, and removing the at least one mechanically stabilizing tie from between the first and second regions.

According to another embodiment, the invention includes providing a planar element including a first electrically and thermally conductive region and a second electrically and thermally conductive region, such that the first and second regions define a spacing therebetween, and wherein the planar element includes at least one mechanically stabilizing tie connected between the first and second regions across the spacing, directly connecting a first terminal of an electrical component to the first region, directly connecting a second terminal of the electrical component to the second region, such that the electrical component bridges the spacing, removing the at least one mechanically stabilizing tie from between the first and second regions, connecting a heat sink in thermal communication to the first and second regions, and electrically insulating the heat sink from the first and second regions.

According to another embodiment, the present invention is directed to an electrical apparatus. The electrical apparatus includes a first electrically and thermally conductive region, a second electrically and thermally conductive region, wherein the first and second regions define a spacing therebetween, an electrical component having a first terminal directly connected to the first region and a second terminal directly connected to the second region, wherein the electrical component bridges the spacing between the first and second regions, a heat sink connected in thermal communication to the first and second regions, and a silicone bonding sheet cured between the heat sink and the first and second regions.

The present invention represents an advancement over the relevant art in that it provides a method of attaching electrical components to a heat dissipative device, such as a heat sink, through lower costing raw materials and lower labor costs, without sacrificing the performance of the electrical components. The present invention also represents an advancement over the relevant art in that it provides a space-effective manner of attaching electrical components to a heat sink. These and other advantages and benefits of the present invention will become apparent from the Detailed Description of the Invention hereinbelow.

BRIEF DESCRIPTION OF THE DRAWINGS

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements. Those of ordinary skill in the art will recognize that other elements may be desirable. However, because such elements are well known in the art, and because they do not facilitate a better understanding of the present invention, a discussion of such elements is not provided herein.

Figure 1:
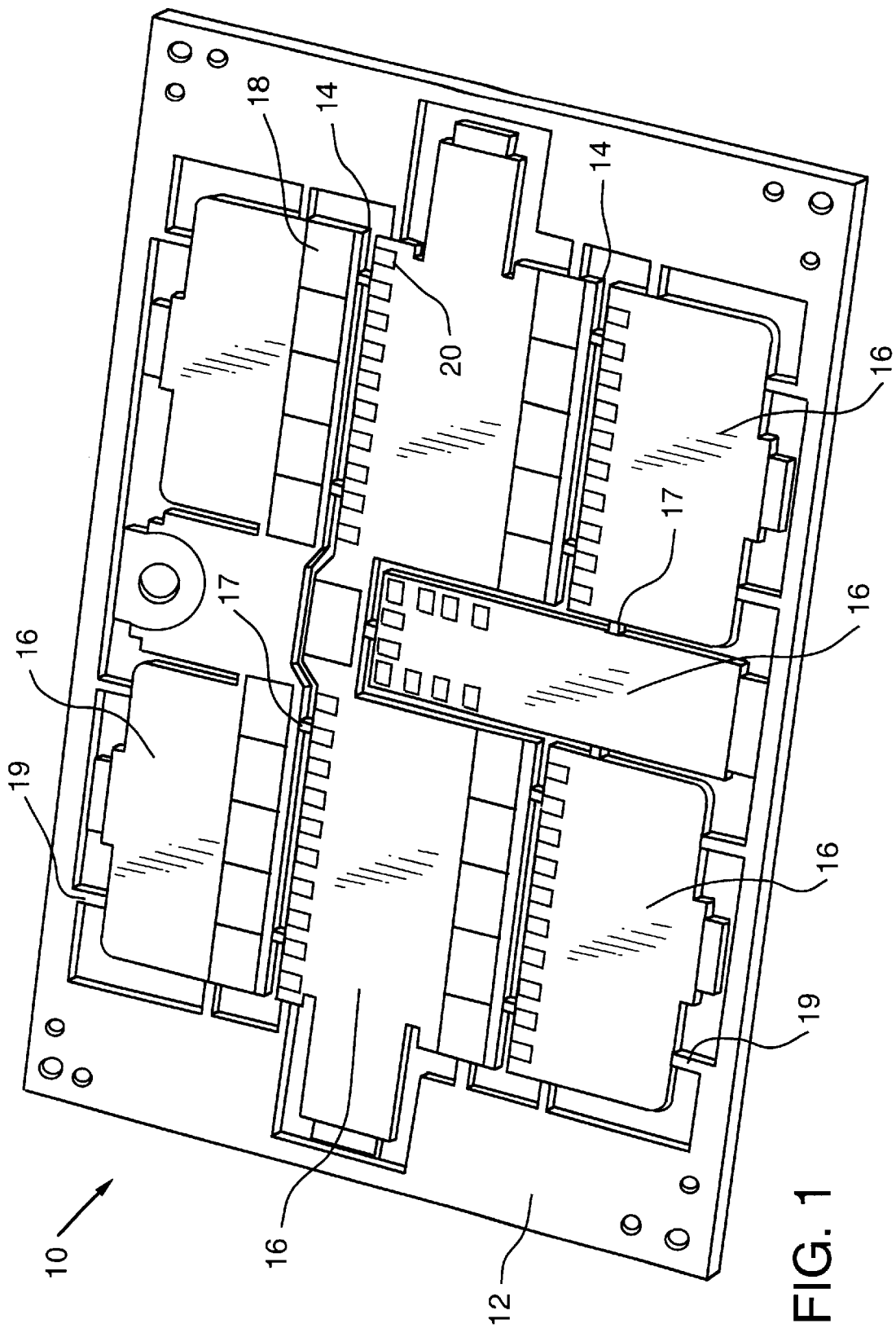
FIG. 1 is a top plan view of a circuit substrate assembly of an electrical apparatus according to the present invention at an early stage in the fabrication thereof.

FIGS. 1 to 6 illustrate various stages in the progression of fabricating an electrical apparatus to dissipate heat from an electrical component according to various embodiments of the present invention. FIG. 1 illustrates an element 10 including a frame 12 and several grooves or spacings 14 separating various regions 16 of the element 10. The element 10, including the regions 16, may be highly two-dimensional and planar, and may be constructed of a non-insulated, electrically and thermally conductive material such as, for example, copper or aluminum. According to the illustrated embodiment, the element 10 includes five regions 16, although in alternative embodiments of the present invention, the element 10 may include more or less regions 16. Using a metallic element 10, such as in one embodiment the present invention, contributes to a lower cost of an electrical apparatus for dissipating heat from electrical components in comparison to using an insulated printed circuit board. In order to facilitate future processing steps, such as soldering as described hereinbelow, the element 10 may include other features such as, for example, a electroplate of solderable material. The solderable material may be, for example, tin, tin alloys, gold, or silver. In addition, prior to processing, the element 10 may be cleaned of impurities which may affect the performance of the electrical components connected thereto.

The element 10 also includes a number of mechanically stabilizing ties 17 connected between the regions 16. According to one embodiment, the element 10 includes one tie 17 connecting two regions 16. The ties 17 provide internal mechanical support for the regions 16. The ties 17 may be constructed, for example, from the same material as the element 10, and may be removed during processing such that they are part of the final assembly. For example, the ties 17 may be removed after the electrical components are connected to the element 10, as described hereinbelow.

In addition to the mechanically stabilizing ties 17, the frame 12 contributes to the mechanical integrity of the element 10 during the fabrication process by keeping each of the regions 16 tied together during processing. The frame 12 may be connected to the various regions 16 by mechanically stabilizing ties 19 connected between the frame 12 and each of the regions 16. In the case of oddly-shaped regions 16, the frame 12 also facilitates processing by providing a structure having a shape, such as rectangular, that is more easily handled by processing equipment. The frame 12, however, is not a necessary part of the final assembly. Furthermore, the frame 12 may be eliminated in some applications such as when sufficient mechanical integrity and ease of processing are provided without the frame 12.

The various regions 16 are separated by the grooves or spacings 14. The width of the spacings 14 depends on the particular application in which the final assembly is to be incorporated, and should be of sufficient width to prohibit the conduction of electrical current across the spacings 14. For example, if the final assembly is to be used in a low-voltage application such as, for example, five volts, the width of the spacings 14 may be, for example, one millimeter or greater. Conversely, if the final assembly is to be used in a high-voltage application, such as up to 1000 V, the width of the spacings 14 may be, for example, 2.5 millimeters or greater.

The element 10, including the frame 12, spacings 14, regions 16, and ties 17, 19, may be formed using, for example, conventional metal stamping techniques. Accordingly, the frame 12, the regions 16, and the ties 17, 19 may all be constructed of the same material, such as, for example, copper. After excising of the frame 12, the element 10 may have dimensions of, for example, approximately five inches by two inches by 40 thousandths (0.040) of an inch.

The element 10 illustrated in FIG. 1 also includes several patches 18, 20 of adhesive material such as, for example, solder paste. The patches 18, 20 may be dispensed on the element 10 using conventional surface mount stenciling techniques. It is not necessary, according to the present invention, for the patches 18, 20 to be dispensed into pre-formed solder pads in the element 10. That is, the patches 18, 20 may be deposited on smooth regions 16, thus obviating the need to process the element 10 to pre-form solder or isolation pads. This is because the solder paste conforms to the leads of the electrical components during soldering, as described hereinbelow. The patches 18, 20 are dispensed on the regions 16 in the locations in which terminals of the electrical components are to be connected. According to the illustrated embodiment, the larger patches 18 are dispensed on the regions 16 in the locations in which body terminals of the electrical components are to be connected to the element 10, and the smaller patches 20 are dispensed in the regions 16 in the locations in which leads from the electrical components are to be connected, as described hereinbelow. According to other embodiments, the patches 18, 20 are dispensed on the regions 16 to accommodate alternatively configured electrical components, such as components having a different number of terminals, and to accommodate alternatively arranged configurations of electrical components.

Figure 2:
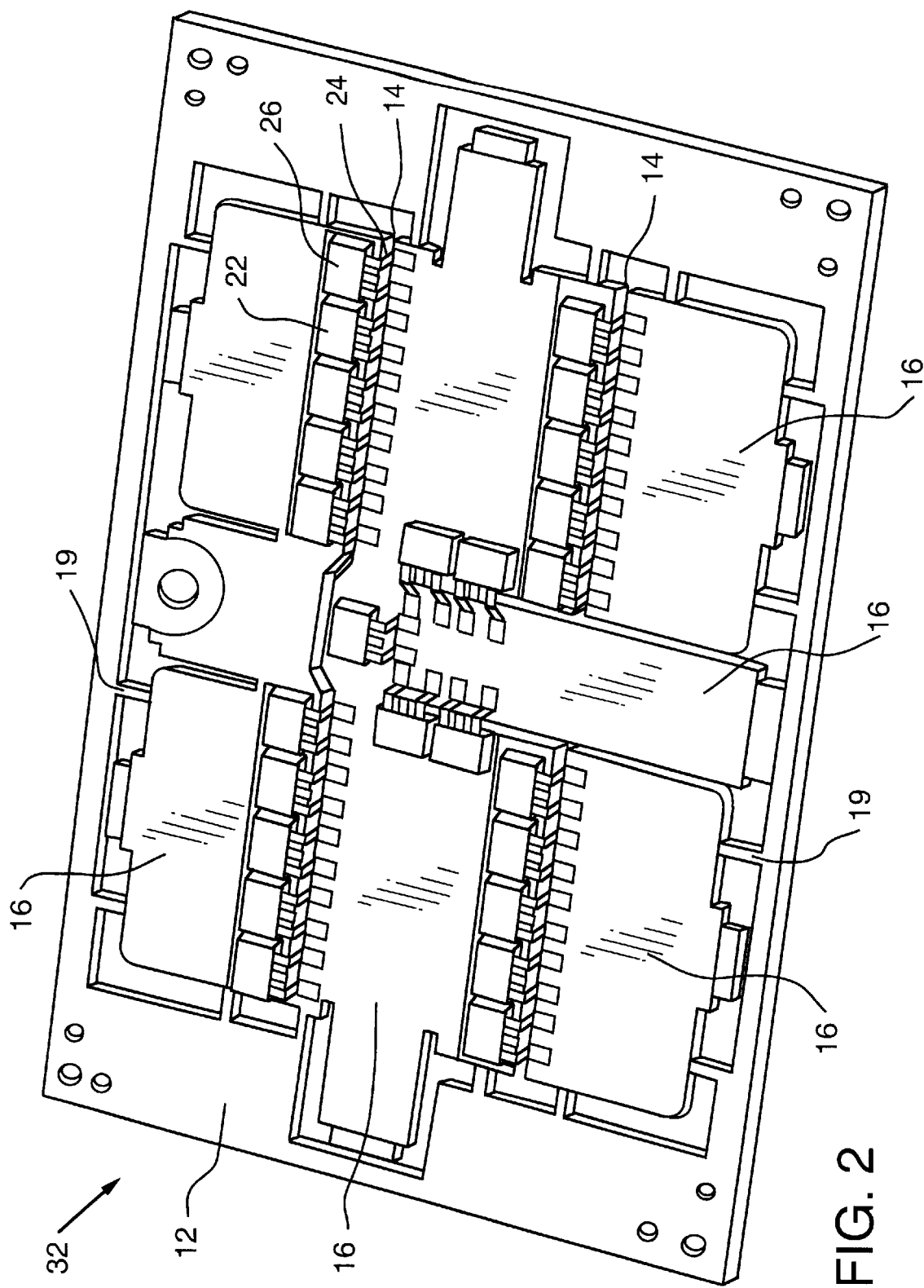
FIG. 2 is a top plan view of the circuit substrate assembly of FIG. 1 after connection of a number of electrical components to the circuit substrate assembly.

FIG. 2 illustrates an electrical apparatus 32 according to one embodiment of the present invention after a number of electrical components 22 have been connected to the element 10. The electrical components 22 may be any electrical component known in the art such as, for example, D-squared or a surface-mountable T0-220 or T0-247 semiconductor devices or microcircuit modules particularly used in the DC to DC module market. According to one embodiment of the present invention, terminals of the electrical components 22 are placed on the patches 18, 20 of solder paste by, for example, a conventional surface mount machine. The electrical components 22 may be connected to the element 10 by, for example, soldering the terminals of the electrical components 22 to the element 10 using a conventional surface mount reflow soldering technique. Each electrical component 22 includes at least two terminals which are connected to separate regions 16. In the illustrated embodiment, the first terminal of electrical component 22 includes a number of leads 24, which may constitute the anode of the component 22, and the second terminal includes a body portion 26 of the component 22, which may constitute the cathode. In the illustrated embodiment, the leads 24 of each electrical component 22 are connected to the same circuit substrate 16 such that they are at the same potential. According to other embodiments of the present invention, the electrical component 22 may include more than two terminals such as, for example, three terminals. An example of such a component is a field-effect transistor, having gate, source, and drain terminals. According to such an embodiment, the terminals could, for example, be connected to separate regions 16. According to an alternative embodiment, one terminal could be connected to a first region 16, a second terminal could be connected to a second region 16, and the third terminal could be connected externally, such as directly connected to a mother board. As discussed hereinbefore, after connecting the terminals of the electrical component 22 to the regions 16, the ties 17 and frame 12 may be removed. The frame 12 may be removed by severing the ties 19.

According to one embodiment of the present invention, the terminals of the electrical components 22 are directly connected to the regions 16. That is, intermediary connecting devices are not used to connect the terminals of the electrical component 22 to the regions 16, such that the electrical component 22 bridges the spacing 14 between the regions 16. According to one embodiment, the terminals of the electrical component 22 are directly connected to the regions 16 by soldering, as described hereinbefore. Directly connecting the terminals of the electrical component 22 to the regions 16 provides mechanical stability between the regions 16 of the element 10 after the mechanically stabilizing ties 17 and the frame 12 are removed. According to alternative embodiments, the terminals of the electrical components 22 may not be directly connected to the regions 16, such as when sufficient mechanical integrity is provided by other means.

During use of the electrical components 22, the electrical components 22 generate heat, which at least at times of heavy use must be dissipated at a rate faster than mere convection of gas around each of the electrical components 22 will permit. For instance, the leads 24 may be connected to the element 10 with a solder which softens/melts at about 178° C. Higher grade solders may have a higher melting temperature, but the 178° C. temperature provides a good benchmark. If heat dissipation from the electrical components 22 is not enhanced, the electrical components 22 may exceed this temperature, leading to wire bonding degradation.

At least two of the terminals of each electrical component 22 are connected to a separate region 16 of the element 10. According to the illustrated embodiment, the leads 24, which constitutes the first terminal, are separated from the body portion 26 of the component 22, which constitutes the second terminal, by a sufficiently wide spacing 14 so as to avoid short-circuiting the component 22. The embodiment illustrated in FIGS. 1 and 2 is but one example of a configuration of the spacings 14 of the element 10, and according to other embodiments of the present invention the spacings 14 may be alternatively arranged to achieve a particular configuration of electrical components 22. The illustrated embodiment includes twenty-five electrical components 22, although in other embodiments of the present invention more or less electrical components 22 may be connected to the element10such as, for example, a single electrical component 22. Because the regions 16 are made of an electrically conductive material, as described hereinbefore, the present invention obviates the need to apply a circuitry layer to the regions 16 to connect the components 22 as desired. Moreover, because numerous electrical components 22 can be connected to the regions 16 of a single element 10 as desired through the configuration of the element 10, when incorporated into a mother board, the present invention permits the consolidation of multiple interleaved solutions into a space-efficient apparatus. Furthermore, because the regions 16 are thermally conductive, the regions 16 dissipate heat generated by the electrical components 22 during use. The heat dissipation qualities of the regions 16 may be modified by, for example, varying the surface area ratio between the regions 16 and the electrical components 22.

Figure 3:
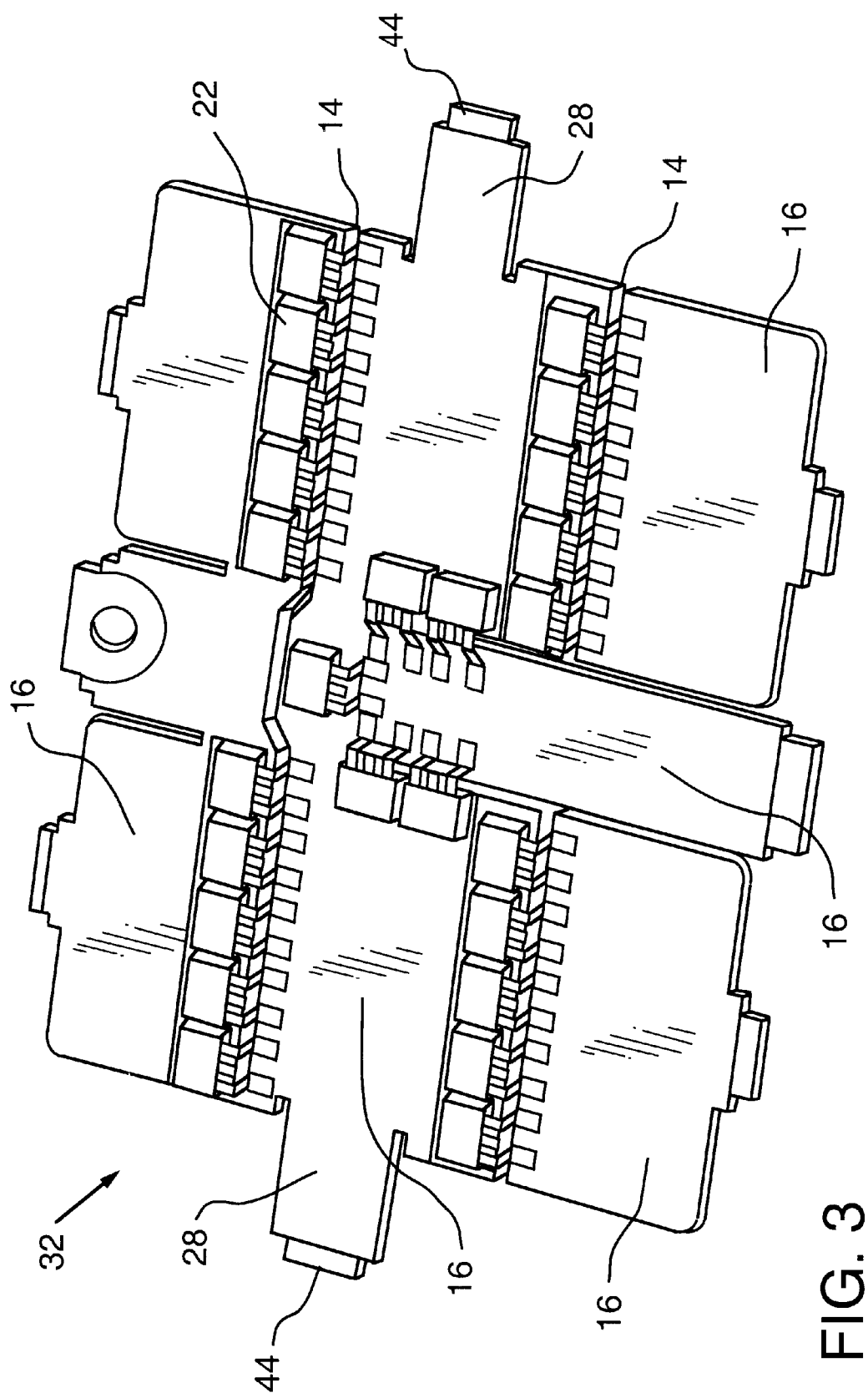
FIG. 3 is a top plan view of the circuit substrate assembly of FIG. 2 after removal of the frame of the circuit substrate assembly.

After connecting the electrical components 22 to the element 10, the frame 12 and the ties 17 may be removed, as illustrated in FIG. 3. The frame 12 need not be removed from the element 10 to realize the benefits of the present invention. Removal of the frame 12, however, facilitates incorporation of the final assembly into a mother board, as described hereinbelow, as well as reduces the overall size of the final assembly. In addition, for an embodiment of the present invention in which the ties 17 are electrically conductive, the ties 17 may be removed to prevent conduction of electrical current between the regions 16.

Figure 4:
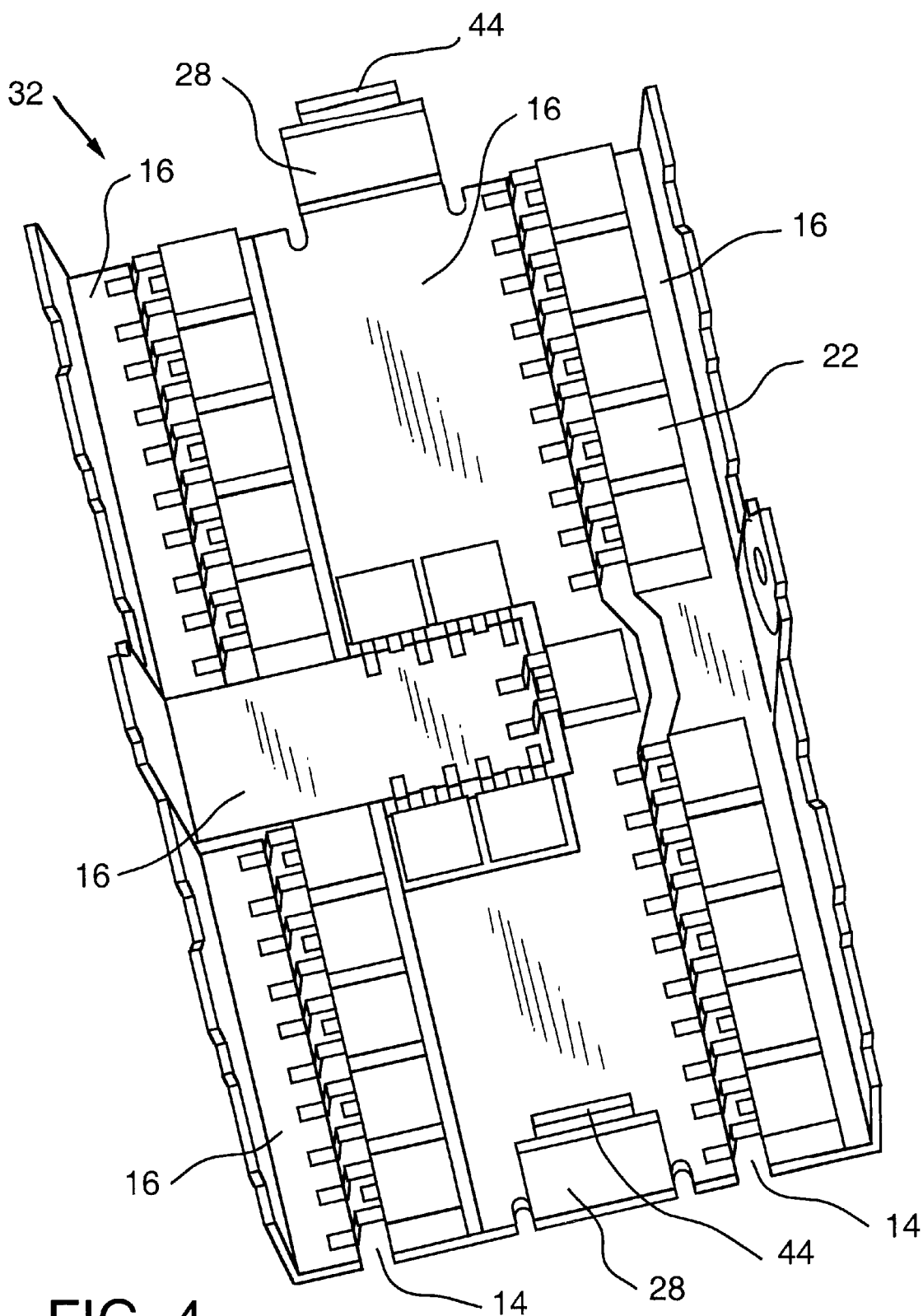
FIG. 4 is a three-dimensional perspective view of the circuit substrate assembly of FIG. 3 after folding of the edges of the circuit substrate assembly.

To economize three-dimensional space, portions of the element 10 may be folded as illustrated in FIG. 4. According to the embodiment illustrated in FIG. 4, the element 10 includes a number of flaps 28 bent at an angle relative to the unfolded portion of the element 10 such as, for example, a ninety degree angle. According to alternative embodiments of the present invention, the element 10 includes a different number of flaps 28 than that illustrated in FIG. 4, to achieve a desired connectivity and mechanical integrity for the final assembly. The element 10, however, need not be folded to realize the benefits of the present invention.

Figure 5:
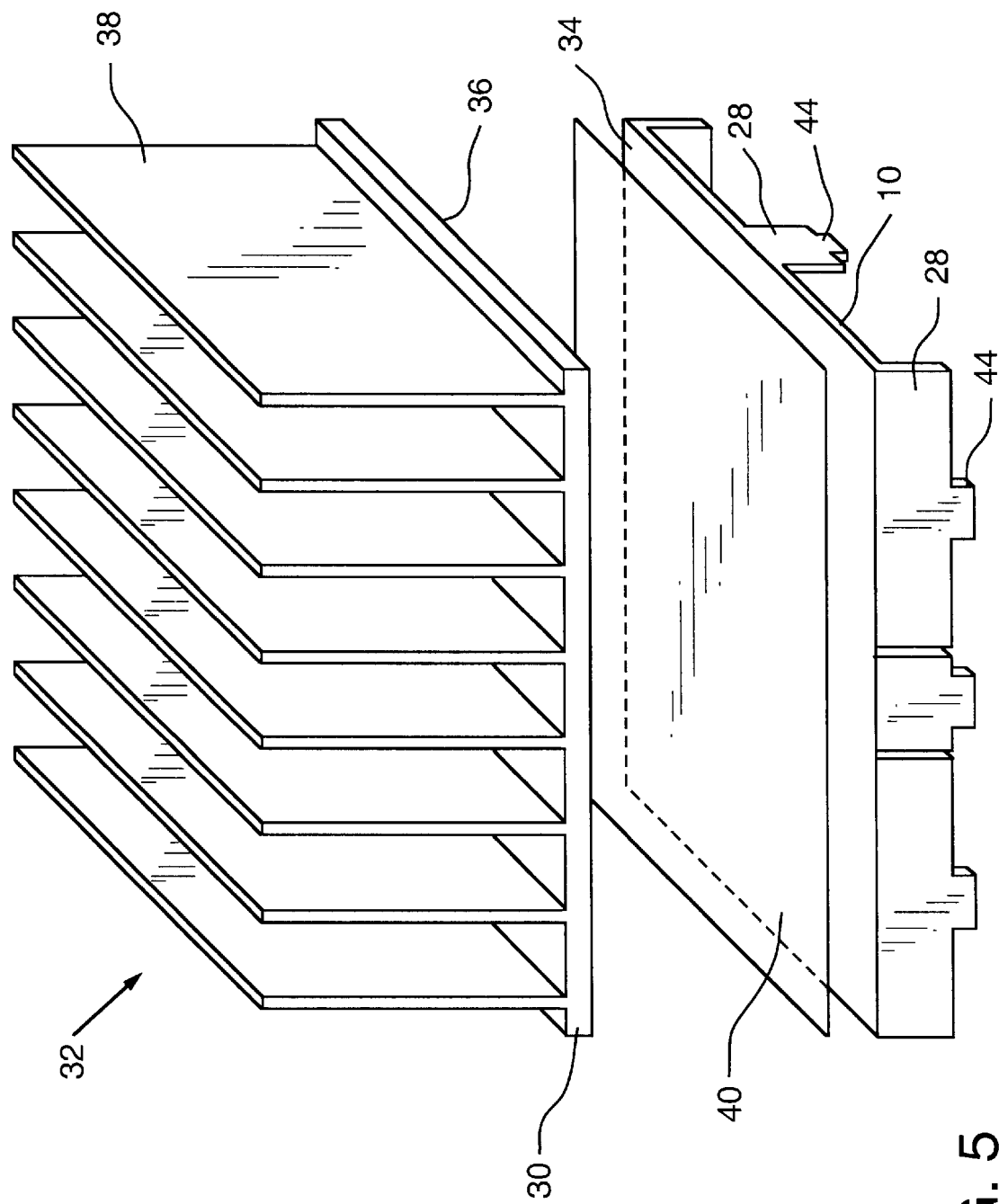
FIG. 5 is an exploded three-dimensional perspective view of the electrical apparatus according to the present invention.
Figure 6:
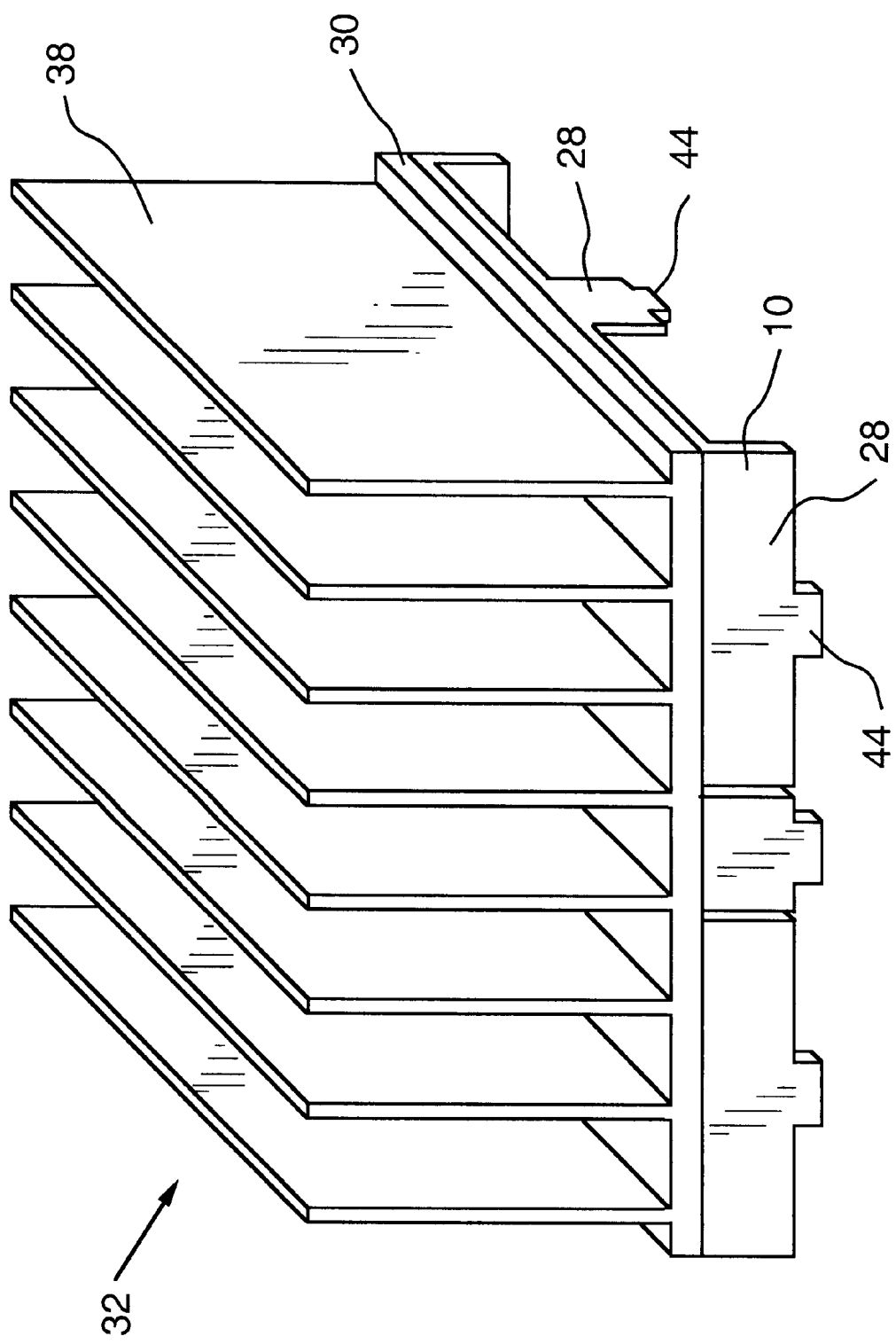
FIG. 6 is a three-dimensional perspective view of the electrical apparatus of FIG. 5 after attachment of the heat sink to the circuit substrate assembly.

According to another embodiment of the present invention, a heat sink 30 is connected to the regions 16 of the element 10. FIGS. 5 and 6 illustrate views of the electrical apparatus 32 according to one embodiment having the element 10 attached to the heat sink 30. A bonding face 34 of the element 10 is connected to a bonding face 36 of the heat sink 30. According to the illustrated embodiment, the bonding face 34 of the element 10 is opposite the surface of the element 10 on which the electrical components 22 are attached, although in other embodiments of the present invention, different bonding faces 34 of the element 10 may be attached to the heat sink 30. For example, according to one embodiment of the present invention, the surface of the element 10 having the electrical components 22 connected thereto is bonded to the heat sink 30.

The heat sink 30 may be any heat sink known in the art and shaped as desired for the particular application. The heat sink 30 is thermally conductive, and may be formed of an electrically conductive material such as, for example, aluminum or copper. Particular examples include 3003, 5052, 6061 or 6063 aluminum, and CDA 110 copper, which provide high thermal conductivity at low cost. As a result of being formed of metal, such as copper or aluminum, the heat sink 30 has a different coefficient of thermal expansion than the electrical components 22. In one embodiment of the present invention, the surface area of the bonding face 34 of the element 10 may be coextensive with the surface area of the bonding face 36 of the heat sink 30, as illustrated in FIGS. 5 and 6. In alternative embodiments, the ratio of the surface areas of the bonding faces 34, 36 are different such as, for example, the surface area of the bonding face 36 of the heat sink 30 being larger than the surface area of the bonding face 34 of the element 10. In other embodiments of the present invention, a number of elements 10 such as, for example, two elements 10, are connected to one heat sink 30. In still further embodiments of the present invention, one element 10 is connected to a number of heat sinks 30 such as, for example, two heat sinks 30. According to such an embodiment, the multiple heat sinks 30 could be connected to the same bonding face 34 of the element 10 or, alternatively, could be connected to separate bonding faces 34 of the element 10. The heat sink 30 may be extruded or otherwise formed as known in the art to include fins 38, as illustrated in FIGS. 5 and 6, although the heat sink 30 may assume different shapes, which may or may not include the fins 38.

According to one embodiment of the present invention, as illustrated in FIG. 5, the element 10 is attached to the heat sink by a bonding sheet 40. The bonding sheet 40 may be formed of a base material which is initially uncured and tacky on both sides. The uncured bonding sheet 40 is placed into contact between the bonding face 34 of the element 10 and the bonding face 36 and the heat sink 30. The bonding sheet 40 may have a substantially uniform thickness, both before and after curing, so as to mate in an intimate relationship against the flat surface of the bonding face 34 of the element 10 and the bonding face 36 of the heat sink 30.

The bonding sheet 40 may be thin and compliant, so as to minimize thermal resistance/thermal impedance at the contact between the element 10 and the heat sink 30. The thickness for the bonding sheet 40 may be, for example, less than about 0.01 inches, and in one particular embodiment is about 0.005 or 0.006 inches. At 5 to 6 mils, the bonding sheet 40 provides sufficient thickness for wetting out and for adapting to any imperfections in the flatness of the bonding faces 34, 36.

Because the bonding sheet 40 is a sheet material rather than a liquid, handling of the bonding sheet 40 is easier, and application of the bonding sheet 40 between the element 10 and the heat sink 30 is much simpler and easier to automate. The bonding sheet 40 may be cut to a selected size prior to placement between the element 10 and the heat sink 30, although the bonding sheet 40 may alternatively be cut to size after application to one of the element 10 and the heat sink 30. The cutting operation of bonding sheet 40 may be automated. The thickness of the bonding sheet 40 is more consistent than with adhesives.

The bonding sheet 40 provides a low thermal impedance. Thermal impedance is essentially equivalent to thermal resistance, but thermal resistance includes application interfacial losses across the contact area. The thermal impedance is affected by the material chosen for the bonding sheet 40 and the thickness of the bonding sheet 40, and by the transfer and curing processes. The bonding sheet 40 may have a thermal impedance of $2°$ C.-in$^2$/Watt or less, and in one embodiment $0.6°$ C.-in$^2$/Watt or less. With a thickness between 0.005 and 0.006 inches, and with a particular transfer and curing processes, the bonding sheet 40 provides a low thermal impedance of typically about $0.15°$ C.-in$^2$/Watt.

Because the bonding sheet 40 is placed between the element 10 and the heat sink 30 in an uncured condition on both sides and then cured in place, intimate thermal contact is made with both the electrical component 22 and the heat sink 30 via the element 10 even without a mechanical fastener and after any application pressure is removed. That is, because the bonding sheet 40 is placed between the element 10 and the heat sink 30 in an uncured condition on both sides and then cured in place by a thermal flash pressure cure, interfacial losses are almost nonexistent. This is in contrast to previous electrical insulators such as sheet materials cured on one or both sides prior to placement, wherein significant interfacial losses may exist at contact between the electrical insulators and the heat sink 30 and the electrical insulators and the electrical components 22 because of insufficient planar alignment or pressure. Because the thermal resistance of both the bonding sheet 40 and the heat sink 30 are low, the cured bonding sheet 40 and the heat sink 30 have a joint thermal conductivity which increases thermal transfer from the electrical components 22 through the element 10 during use.

The bonding sheet 40 provides a high dielectric breakdown voltage, despite its relative thinness. The inherent dielectric breakdown voltage of the uncured bonding sheet 40 is further enhanced by following a proper placement and curing procedure. The high dielectric breakdown voltage is particularly important when the electrical components 22 handle high voltage or high power. For instance, the dielectric breakdown voltage of the bonding sheet 40 may be at least 1200 volts AC, and in one embodiment is at least about 2100 volts AC. At a thickness of 0.005 to 0.006 inches, and using a particular placement and curing procedures, the bonding sheet 40 provides a dielectric breakdown voltage which is typically about 4000–5000 volts AC.

Placement of the bonding sheet 40 between the element 10 and the heat sink 30 is much easier to automate than either application of an adhesive or attachment with mechanical fasteners. Even when the bonding sheet 40 is cured in-situ, the potential automation benefits in placement more than offset the additional cost of curing with the attached heat sink 30 and element 10. The curing process may be carried out in batch, simultaneously curing numerous bonding sheets 40 each between attached heat sinks 30 and elements 10 having a number of electrical components 22 connected thereto, while attachment with mechanical fasteners or adhesives must be performed individually for each element 10 and heat sink 30.

The bonding sheet 40 is cured between the element 10 and the heat sink 30 to attach the electrical components 22 to the heat sink 30 via the element 10 without mechanical fasteners. The exact curing process depends upon the material chosen for the bonding sheet 40. In one embodiment of the present invention, the bonding sheet 40 is a silicone bonding sheet cured, for example, in a thermal flash pressure cure. The bonding sheet 40 may include an uncured silicone rubber base material. The silicone rubber base material may be filled with finely-divided fibers or particles of glass, oxides, boron nitrides or other heat conducting substances and may be supported on a glass cloth. The glass cloth may be very thin and only a small proportion of the overall bonding sheet thickness. For instance, the glass cloth may have a thickness of about 0.0015 inches for use in a material having a total uncompressed thickness of about 0.005 or 0.006 inches. The glass cloth is a cost effective way to add tensile strength to the material and prevents the bonding sheet 40 from being easily torn.

The cured bonding sheet 40 may be quite resistant to degradation over time or with thermal cycling, and remains flexible and compliant to absorb the stresses created by differing thermal expansion rates of the electrical components 22, the element 10, and the heat sink 30 over a significant product life. In particular, the degradation of the electrical and mechanical characteristics of the bonding sheet 40 is typically acceptably minimal for most applications over the maximum temperature range seen by the bonding sheet 40, such as from a low temperature of about −20° C. to a heated, steady state operational high temperature of about 150° C.

Because the electrical components 22 are attached via the element 10 to the heat sink 30 without mechanical fasteners, no additional space is required for mechanical fasteners. The bonding sheet 40 adds only the thickness of the very thin material to the electrical apparatus 32. No flange or other extending structure is required from either the heat sink 30 or the element 10, and the bonding sheet 40 can thus be used without increasing the area of either the element 10 or the heat sink 30. Further, because no bolts or screws are used, there are no torqueing requirements, and no possibility of using too high or low a torque or compressive force in attaching the electrical components 22 to the heat sink 30. Additionally, no machining of the heat sink 30 is required, no abrasions or discontinuities are created in the heat sink 30, no extra hardware is required, and necessity of insulated bushings is obviated. Attachment with the bonding sheet 40 introduces no additional metal fasteners within proximity to the electrical components 22 or its leads 24. In contrast to a bolt attachment, curing of the bonding sheet 40 permanently attaches the electrical components 22 to the heat sink 30 through the element 10.

The bonding sheet 40 may be provided on a dispensing roll. In order that the uncured bonding sheet 40 will easily be separated from adjacent wraps of the roll without affecting the thickness of the bonding sheet 40, a release liner may be placed between wraps of uncured bonding sheet 40. The bonding sheet 40 material may include a inhibitor which becomes effective upon heating to a predetermined temperature, such as 140–170° C. During removal of the bonding sheet 40 from the roll, the release liner will ordinarily remain attached to the outside of the roll and to the outer face of the bonding sheet 40.

The bonding sheet material may be cut to size immediately upon removal from the roll and with the release liner attached, and prior to placement between the element IO and the heat sink 30. Alternatively, the bonding sheet 40 may be cut to size after application to one of the element 10 and the heat sink 30, and either before or after removal of the release liner.

According to one embodiment of the present invention, the uncured bonding sheet 40 is placed onto the heat sink 30 with the release liner still attached on the outer side of the bonding sheet 40. Alternatively, the release liner may be removed from the bonding sheet 40 prior to placement onto the heat sink 30 or the element 10, such as before cutting the bonding sheet to size. Removal of the release liner prior to cutting to size simplifies the removal step, as the release liner can be removed as a single strip rather than having to individually remove release liners from each of the bonding sheets 40.

Depending on the thermal mass of the heat sink 30 and the method of heat applied during cure, the heat sink 30 may be preheated above room temperature prior to and/or during transfer of the uncured bonding sheet 40 to the heat sink 30, such as to a preheating temperature of about 120° F.+/−20° F. This preheating temperature allows the heat sink 30 to be handled with bare skin or with gloves, but minimizes the thermal ramp-up time for the cure.

A significant transfer pressure is preferably used for a short duration to apply the bonding sheet 40 to the heat sink 30. The specific pressures and time depend on specific applications. In some embodiments, the transfer pressure is at least about 100 psi. In other embodiments it is 500 psi for about 2 to 3 seconds. The high transfer pressure yields a higher, more consistent dielectric breakdown voltage and a lower thermal resistance by minimizing flatness variations for wet-out and by increasing the density of the material. The transfer pressure may be applied by a simple planar press pressing on opposite sides of the heat sink 30. Because the heat sink 30 is typically an integrally formed single piece of metal or other strong metal structure, the heat sink 30 can withstand this high pressure. Alternatively, if a transfer pressure is applied to the element 10 (i.e., either by transferring the bonding sheet 40 to the element 10 before applying the heat sink 30, or by applying pressure to the heat sink 30/element 10 combination), the magnitude of the transfer pressure may need to be modified.

If transfer pressure is applied to both the heat sink 30 and the element 10 with the bonding sheet 40 therebetween, it may be applied with a temporary clip which is removed either before or after the bonding sheet 40 has cured. Alternatively, the transfer pressure may be applied by a press and without a separate mechanical fastener, and prior to any curing of the bonding sheet 40. Application of the transfer pressure to the bonding sheet 40 on the heat sink 30 can be done easily, at high pressure, with relatively simple equipment, to a single heat sink 30 or in batch. The transfer pressure may be applied prior to removal of the release liner, so the release liner prevents the tackiness of the uncured bonding sheet 40 from sticking to the press.

After removal of the release liner, the element 10 may be applied to the newly exposed side of the bonding sheet 40, and the curing process is begun. The bonding sheet 40 may cure primarily due to the application of heat. The curing process may involve a pressure cure, which may be followed by a secondary cure in which no pressure is applied. In one embodiment of the pressure cure, the bonding sheet 40 is heated at a minimum temperature of at least about 140° C., to break down an inhibitor in the bonding sheet 40 and allow the curing of the silicone to begin. After inhibitor break down, curing will continue to a minimum temperature of about 85° C. The pressure cure may be conducted at a temperature of 185° C. or less, such as approximately 160° C., for an effective curing duration. The 185° C. maximum temperature, applied to the heat sink 30, prevents solder connections on the electrical components 22 from exceeding 178° C. Bonding sheets 40 of other materials may cure through other phenomena, such as over time, due to, for example, ultra-violet or infrared radiation.

The pressure cure schedule may be, for example, at least one minute, or more specifically about three to four minutes, under a relatively low pressure of, for example, between 30 and 100 psi, or more specifically approximately 75 psi, while the heat sink 30 is heated at approximately 160° C. The pressure may be applied in a manner similar to that described for the transfer pressure, that is, either with a mechanical clip or with a press. If a press is used, it should not be positionally fixed during compression, but rather should allow thermal expansion of the element 10 and the heat sink 30 and resultant movement without a significant change in pressure applied. Applying pressure in this pressure cure compresses the bonding sheet 40 in the interface between the element 10 and the heat sink 30. More precisely, while the glass cloth may be substantially uncompressed by the pressure cure pressure, the pressure applied in the pressure cure forces the uncured silicone material into interstices in the glass cloth and into intimate surface contact with the element 10 and the heat sink 30. For example, with an uncured bonding sheet 40 with a thickness of about 0.005 to 0.006 inch, and with a glass cloth thickness of about 0.0015 inches, the pressure of the pressure cure may compress the bonding sheet 40 to about 0.003 to 0.0035 inch thickness. Applying pressure in the pressure cure leads to an increased dielectric breakdown voltage and increased thermal conductivity through the bonding sheet 40.

Using rheology test methods, the preferred pressure cure process has been shown to produce "almost complete" cross-linking reaction of the bonding sheet 40, leaving a secure attachment between the bonding sheet 40 and both the element 10 and the heat sink 30. After the primary cure, the element 10 and attached heat sink 30 can be readily handled without affecting the attachment.

Depending upon the intended use of the electrical components, the pressure cure may sufficiently secure the element 10 to the heat sink 30 without further processing. However, lap shear testing has indicated that minor increases in cross-linking density (resulting in less than 10% increase in lap shear) occur with additional secondary cure processing. The secondary cure generally involves removing the pressure of the pressure cure and applying heat at a temperature slightly higher than the pressure cure temperature and for a longer duration. The temperature of the secondary cure should still be low enough as to not soften or melt any soldered connections, such as applying heat to the heat sink 30 at a temperature of 185° C. or less. For instance, the secondary cure schedule may include fifteen minutes where the heat sink 30 is heated at 175° C. followed by thirty minutes where the heat sink 30 is heated at 145° C. These secondary cure processes ensure a cross-linking reaction which is in excess of 99%.

To heat the bonding sheet 40 for curing (both pressure cure and secondary cure), it is desirable to apply heat directly to the heat sink 30. Because of its high thermal conductivity, the heat sink 30 readily heats the bonding sheet 40, while the electrical components 22 are heated to a lesser extent via the element 10, and not quite as hot as the bonding sheet 40. The heat sink 30 may be directly heated by a variety of methods, such as applying a gas flame to the heat sink 30, contacting the heat sink 30 with a platen heated with, for example, a resistive element, or by transmitting an induction current through the heat sink 30. Another way of heating the bonding sheet 40 for curing involves running the electrical components 22 so that the electrical components 22 generate heat.

Alternatively, the apparatus 32 may be placed in an oven, with the entire combination being heated. While oven heating of the heat sink 30/element 10 combination is effective, the bonding sheet 40 is somewhat thermally insulated from the oven heat by both element 10 and the heat sink 30, and thus will be the slowest of the three elements to heat. Additionally, the oven temperature should be maintained less than the melting temperature of any solder connections. Further, utilizing an IR oven allows profiling to be completed to the maximum temperature rise over a given amount of time.

As shown in FIG. 5, the bonding sheet 40 may be used to attach a single element 10 to a single heat sink 30. According to alternative embodiments of the present invention, a single bonding sheet 40 may be used to attach multiple circuit substrate assemblies 10 to a single heat sink 30. For other embodiments, multiple bonding sheets 40 may be used to attach multiple elements 10 to a single heat sink 30. Additionally, multiple bonding sheets 40 may be used to attach a single element 10 to a single heat sink 30. Further, a single bonding sheet 40 may be used to attach a single element 10 to multiple heat sinks 30. Still further multiple bonding sheets 40 may be used to attach the element 10 to a single heat sink 30. In each of these embodiments, the cured bonding sheet 40 and the heat sink 30 have a joint thermal conductivity to increase thermal transfer from the electrical components 22 through the element 10 during use. All of these various embodiments are simply assembled due to the ease of handling of the bonding sheet 40 and the simplicity of attachment without adhesives or mechanical fasteners.

According to another embodiments of the present invention, the bonding sheet 40 is an epoxy bonding sheet. For such an embodiment, the epoxy bonding sheet 40 may be connected between the heat sink 30 and the element 10 in a conventional fashion. In addition, the element 10 may be connected to the heat sink 30 by one or more mechanical devices such as, for example, screws. For an embodiment using screws to connect the element 10 to the heat sink 30, the epoxy bonding sheet 40 may be applied between the bonding faces 34, 36 of the element 10 and the heat sink 30, and dielectric material, such as insulated bushings, may be provided between the screws and the element 10 to insulate the element 10 from the screws. According to another embodiment of the present invention, the element 10 is connected to the heat sink 30 by a pressure sensitive adhesive (PSA). Pressure sensitive adhesives typically do not posses the thermal characteristics of silicone bonding sheets and epoxy bonding sheets, however.

Figure 7:
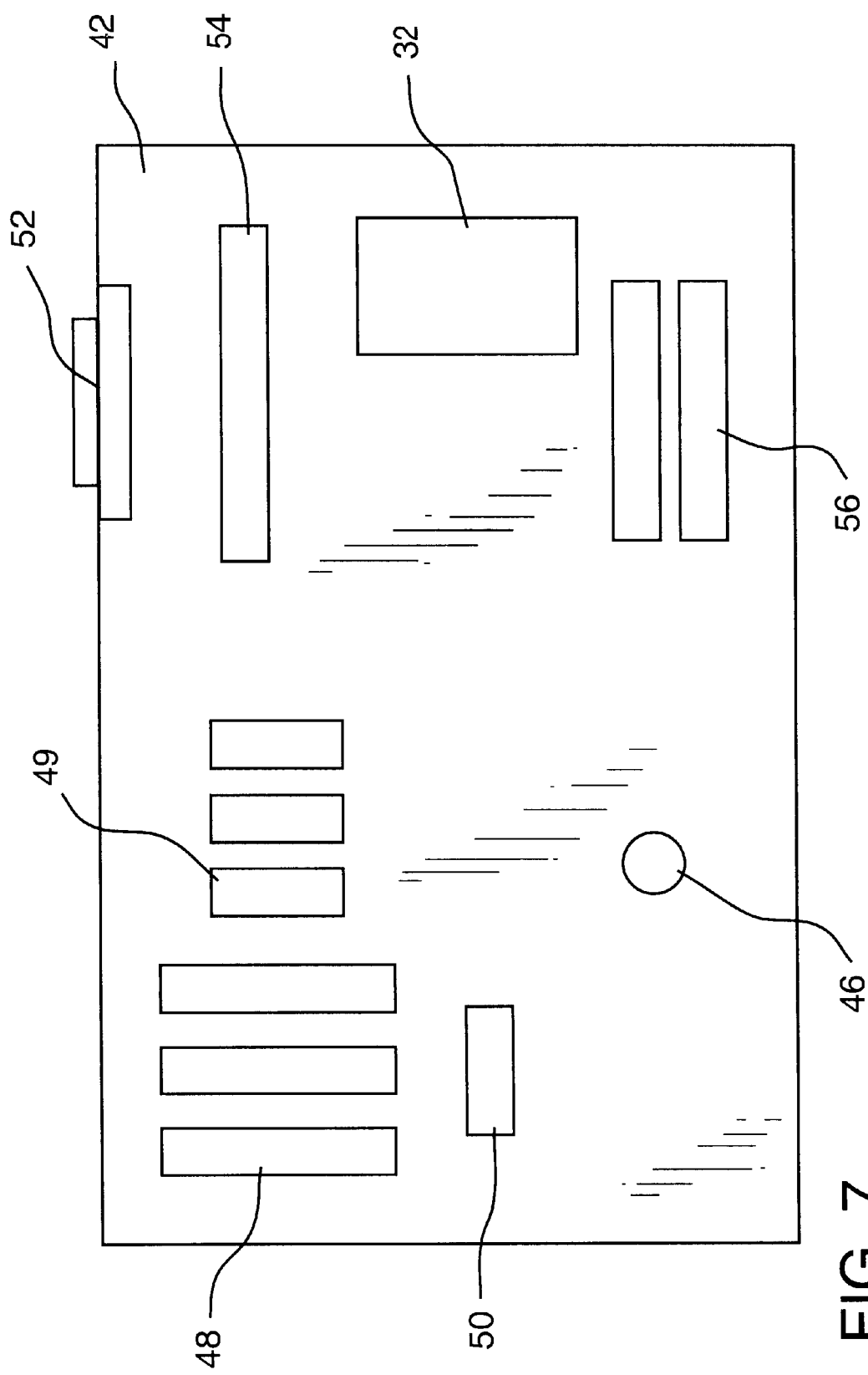
FIG. 7 is a top plan view of a mother board having the electrical apparatus of FIG. 6 connected thereto.

FIG. 7 illustrates a mother board 42 having the electrical apparatus 32 of the present invention connected to the mother board 42. In the illustrated embodiment, the electrical apparatus 32 includes the heat sink 30, however, an electrical apparatus 32 not having a heat sink 30 may also be connected to the mother board 42. The electrical apparatus 32 may be connected to the mother board 42 by inserting flanges 44 on the flaps 28 of the apparatus 32 into slots on the mother board 42 and soldering, such as by standard wave soldering, the apparatus 32 to the mother board 42. The dimensions of the flanges 44 can be varied based on the mother board's applications. That is, the flanges 44 preferably are of sufficient dimensions to handle the current flow. The mother board 42 may also contain, for example, a battery 46, ISA bus slots 48, PCI bus slots 49, a BIOS 50, ports 52 such as parallel and serial ports, a processor 54, and floppy and hard drive connectors 56. In another embodiment, the electrical apparatus 32 of the present invention may be incorporated as one sub-assembly of a module, such as a power supply module, for connection to a mother board.

Those of ordinary skill in the art will recognize that many modifications and variations of the present invention may be implemented. The foregoing description and the following claims are intended to cover all such modifications and variations. Furthermore, the materials and processes disclosed are illustrative, but are not exhaustive. Other materials and processes may also be used to make devices embodying the present invention. In addition, the described sequences of the processing may also be varied.

What is claimed is:

1. A method for fabricating an electrical apparatus, comprising:
   providing a planar element including a first electrically and thermally conductive region and a second electrically and thermally conductive region, such that the first and second regions define a spacing therebetween, and wherein the planar element includes at least one mechanically stabilizing tie connected between the first and second regions across the spacing;
   directly connecting a first terminal of an electrical component to the first region;
   directly connecting a second terminal of the electrical component to the second region, such that a lead of the electrical component bridges the spacing; and
   removing the at least one mechanically stabilizing tie from between the first and second regions.

2. The method of claim 1, wherein providing a planar element includes providing a stamped metallic sheet including first and second metallic regions.

3. The method of claim 2, wherein providing a stamped metallic sheet includes providing a stamped copper sheet including first and second copper regions.

4. The method of claim 1, wherein removing the at least one mechanically stabilizing tie includes cutting the at least one mechanically stabilizing tie.

5. The method of claim 1, wherein directly connecting includes soldering the first terminal of the electrical component to the first region and the second terminal of the electrical component to the second region.

6. The method of claim 5, further comprising electroplating at least one of the first and second regions with a solderable material before directly connecting the first and second terminals of the electrical component.

7. The method of claim 6, wherein electroplating with a solderable material is selected from the group consisting of electroplating with tin, electroplating with tin alloy, electroplating with gold, and electroplating with silver.

8. The method of claim 1, wherein the providing a planar element includes providing the planar element having a frame connected to the first region by at least one mechanically stabilizing tie and connected to the second region by at least one mechanically stabilizing tie.

9. The method of claim 8, further comprising removing the frame from the first and second regions.

10. The method of claim 9, wherein the removing the frame is performed subsequent to the removing the at least one mechanically stabilizing tie between the first and second regions.

11. The method of claim 1, further comprising folding at least one of the first and second regions.

12. The method of claim 11, wherein folding the at least one of the first and second regions includes folding the first regin at a ninety degree angle and folding the second region at a ninety degree angle.

13. The method of claim 11, wherein folding at least one of the first and second regions is performed subsequent to the removing the at least one mechanically stabilizing tie.

14. The method of claim 1, wherein the providing the planar element includes providing a planar element including a third electrically and thermally conductive region, such that the first and third regions define a second spacing therebetween, and wherein the planar element includes at least one mechanically stabilizing tie connected between the first and third regions across the second spacing.

15. The method of claim 14, further comprising:
   directly connecting a first terminal of a second electrical component to the first region;
   directly connecting a second terminal of the second electrical component to the third region, such that the second electrical component bridges the second spacing; and
   removing the at least one mechanically stabilizing tie from between the first and third regions.

16. The method of claim 1, further comprising electrically connecting the first and second regions to a mother board.

17. A method of fabricating an electrical apparatus, comprising:
   providing a planar element including a first electrically and thermally conductive region and a second electrically and thermally conductive region, such that the first and second regions define a spacing therebetween, and wherein the planar element includes at least one mechanically stabilizing tie connected between the first and second regions across the spacing;
   directly connecting a first terminal of an electrical component to the first region;
   directly connecting a second terminal of the electrical component to the second region, such that the electrical component bridges the spacing;
   removing the at least one mechanically stabilizing tie from between the first and second regions;
   connecting a heat sink in thermal communication to the first and second regions; and
   electrically insulating the heat sink from the first and second regions.

18. The method of claim 17, wherein:
   the directly connecting the first terminal includes electrically connecting the first terminal of the electrical component to a first surface of the first region;
   the directly connecting the second terminal includes electrically connecting the second terminal of the electrical component to a first surface of the second region; and
   the connecting the heat sink includes connecting the heat sink to second surfaces of the first and second regions.

19. The method of claim 17, wherein connecting the heat sink and electrically insulating include:
   placing a silicone bonding sheet between the heat sink and the first and second regions; and
   curing the silicone bonding sheet in a thermal flash pressure cure.

20. The method of claim 19, wherein curing the silicone bonding sheet includes curing the silicone bonding sheet at a temperature between eighty-five degrees Celsius and one hundred-eighty degrees Celsius.

21. The method of claim 20, wherein curing the silicone bonding sheet includes curing the bonding sheet at a temperature of approximately one hundred sixty degrees Celsius.

22. The method of claim 19, wherein curing the silicone bonding sheet includes curing the silicone bonding sheet at a pressure between thirty psi and one hundred psi.

23. The method of claim 22, wherein curing the silicone bonding sheet includes curing the silicone bonding sheet at a pressure of approximately seventy-five psi.

24. The method of claim 19, wherein curing the silicone bonding sheet includes curing the silicon bonding sheet for three to four minutes.

25. The method of claim 17, wherein connecting the heat sink and electrically insulating include connecting the first and second regions to the heat sink with an epoxy bonding sheet.

26. A method for fabricating an electrical apparatus, comprising:
   providing a planar element including:
      a first electrically and thermally conductive region;
      a second electrically and thermally conductive region, such that the first and second regions define a first spacing therebetween; and
      a third electrically and thermally conductive region, such that the first and third regions define a second spacing therebetween, wherein the planar element includes at least one mechanically stabilizing tie connected between the first and second regions across the first spacing and at least one mechanically stabilizing tie connected between the first and third regions across the second spacing;
   directly connecting a first terminal of a first electrical component to the first region;
   directly connecting a second terminal of the first electrical component to the second region, such that the first electrical component bridges the first spacing;
   directly connecting a first terminal of a second electrical component to the first region;
   directly connecting a second terminal of the second electrical component to the third region, such that the second electrical component bridges the second spacing;
   removing the at least one mechanically stabilizing tie from between the first and second regions; and
   removing the at least one mechanically stabilizing tie from between the first and third regions.

* * * * *

UNITED STATES PATENT AND TRADEMARK OFFICE
CERTIFICATE OF CORRECTION

PATENT NO.    : 6,370,767 B1
DATED         : April 16, 2002
INVENTOR(S)   : Solberg et al.

It is certified that error appears in the above-identified patent and that said Letters Patent is hereby corrected as shown below:

Column 14,
Line 36, immediately after the phrase "Still further", please insert a comma.

Signed and Sealed this

Thirtieth Day of July, 2002

Attest:

Attesting Officer

JAMES E. ROGAN
Director of the United States Patent and Trademark Office